Figure 1:
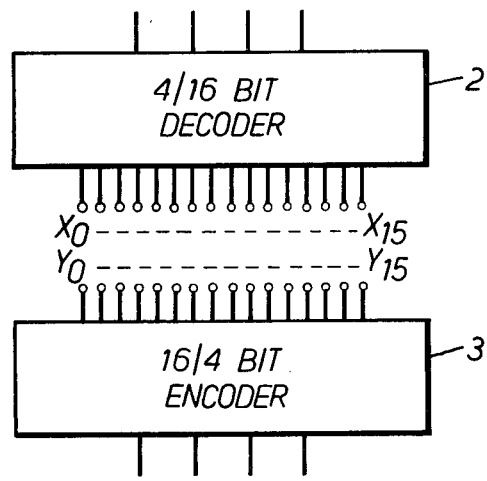

United States Patent [19]
Payling

[11] 4,206,507
[45] Jun. 3, 1980

[54] FIELD PROGRAMMABLE READ ONLY MEMORIES

[76] Inventor: Reginald Q. Payling, 131 Folds Lane, Sheffield, S8 OET, England

[21] Appl. No.: 954,633

[22] Filed: Oct. 23, 1978

[51] Int. Cl.² ............................................. G11C 17/00
[52] U.S. Cl. ................................... 365/94; 340/166 R
[58] Field of Search ................. 365/94, 102, 103, 104, 365/105; 340/166 R, 147 MT

[56] References Cited

U.S. PATENT DOCUMENTS

| | | | |
|---|---|---|---|
| 2,712,309 | 7/1955 | Offner | 340/166 R |
| 3,371,320 | 2/1968 | Lachenmayer | 340/166 R |
| 3,609,713 | 9/1971 | Wooton et al. | 365/94 |
| 3,796,848 | 3/1974 | Southworth | 340/166 R |
| 3,812,302 | 5/1974 | Herr | 340/166 R |
| 4,093,942 | 6/1978 | Suzuki et al. | 340/166 R |

*Primary Examiner*—Stuart N. Hecker
*Attorney, Agent, or Firm*—Mason, Fenwick & Lawrence

[57] ABSTRACT

A field-programmable read only memory which is programmed by means of flying-lead connections, and which is therefore easily re-programmed. The device can be provided with interface circuits such as relays and opto-couplers to provide a compact and versatile control module.

8 Claims, 11 Drawing Figures

FIELD PROGRAMMABLE READ ONLY MEMORIES

This invention relates to digital data stores.

Digital data stores are used in the majority of digital data processing systems. Many of these systems require data stores for storing programs or microprograms, or for data storage which may be either temporary or permanent. Data stores range from those with storage capacities of several million bits to those with only a few bits of storage capacity. Data stores of up to several thousand bits of storage capacity are generally of the semiconductor type which use flip-flops as the storage units.

Digital data processing techniques are being applied to process control in industry, where electronic equipment can provide such advantages as compactness, reliability and flexibility. In these applications it is known to use the same logic unit in a number of different systems, the only difference being in the organisation of the program stores used in the different systems. In many instances an existing control system may be adapted to a different system by changing the program store or stores. These may be provided as plug-in units and are generally of the semi-conductor type providing several thousand bits of storage.

In industrial process control where it is not always possible to arrive at an optimum set of conditions by theoretical considerations alone, it may be practicable to set up a system which works and then modify it during commissioning to arrive at the best solution. When the practical approach is used, an electronic control system based on a central logic unit and a plug-in program store presents the difficulty that the parameters for the program store are not known and the program store cannot therefore be specified.

Existing programmable memories are programmed externally to the equipment, and in most types the program cannot be altered because the programming operation involves the fusing of selected links within the memory. Any unsuitably programmed memory must therefore be discarded.

It is an object of the present invention to overcome this difficulty.

According to the invention, a field programmable read only memory comprises a decoder having N output terminals and $\log_2 N$ input terminals each being an input terminal to the memory, an encoder having N input terminals and $\log_2 N$ output terminals each being an output terminal from the memory, and a connection matrix so arranged as to be capable of connecting any one or more of the output terminals of the decoder to any one or more of the input terminals to the encoder.

In an embodiment of the invention, a field programmable read only memory forms part of an adaptive process controller which includes an input interfacing network comprising an optically coupled isolator having $\log_2 N$ channels each having an output terminal connected to an input terminal of the decoder and an input port. The adaptive process controller may also include an output interfacing network comprising $\log_2 N$ relays each having an input terminal connected to an output terminal of the encoder and an output port providing an output port from the adaptive process controller.

The preferred connection matrix of the field programmable read only memory comprises first and second terminal blocks each having N terminals, each of the terminals of the first terminal block being connected to an output terminal of the decoder and each of the terminals of the second terminal block being connected to an input terminal of the encoder, and up to N flying leads arranged to connect any one of the terminals of the first terminal block to any one of the terminals of the second terminal block.

A field programmable read only memory according to the invention is capable of providing N output words each of $\log_2 N$ bits, and a number of such units may be connected in parallel to provide longer output words, or input words, or both.

In operation, the read only memory is arranged as a program store by applying a word of $\log_2 N$ bits to the input terminals of the decoder and arranging the connection matrix to provide a desired output word which may be changed by altering the connection matrix arrangement. The input terminals may be connected to an addressable read only memory, thereby providing a range of input words to the field programmable read only memory.

In the adaptive process controller arrangement, the optically coupled isolator provides a versatile interface arrangement in that it is insensitive to substantial variations between the output signal range of process plant and the signal requirements of the field programmable read only memory. Optically coupled isolators are also useful to provide some immunity to electromagnetic interference.

Figure 5:
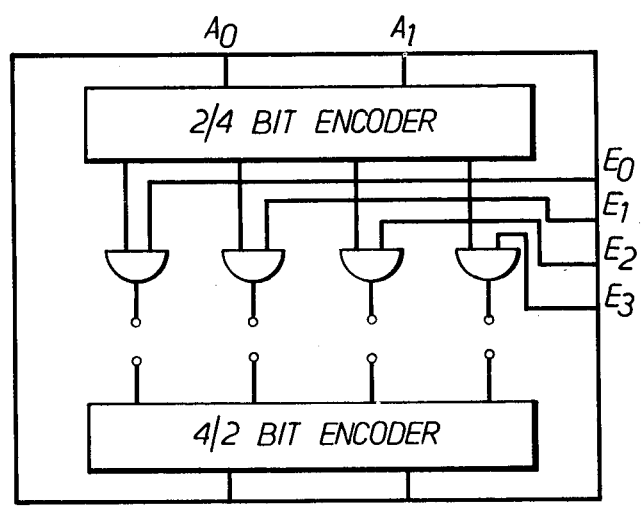
Figure 2:
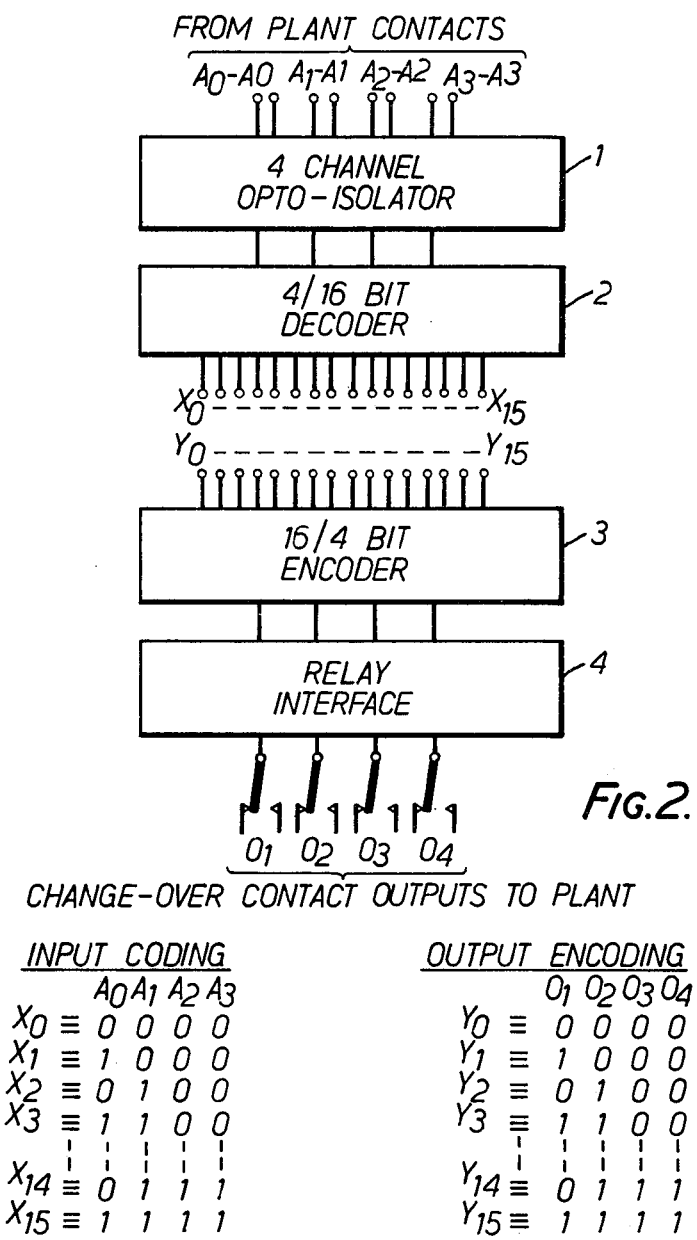
Figure 3:
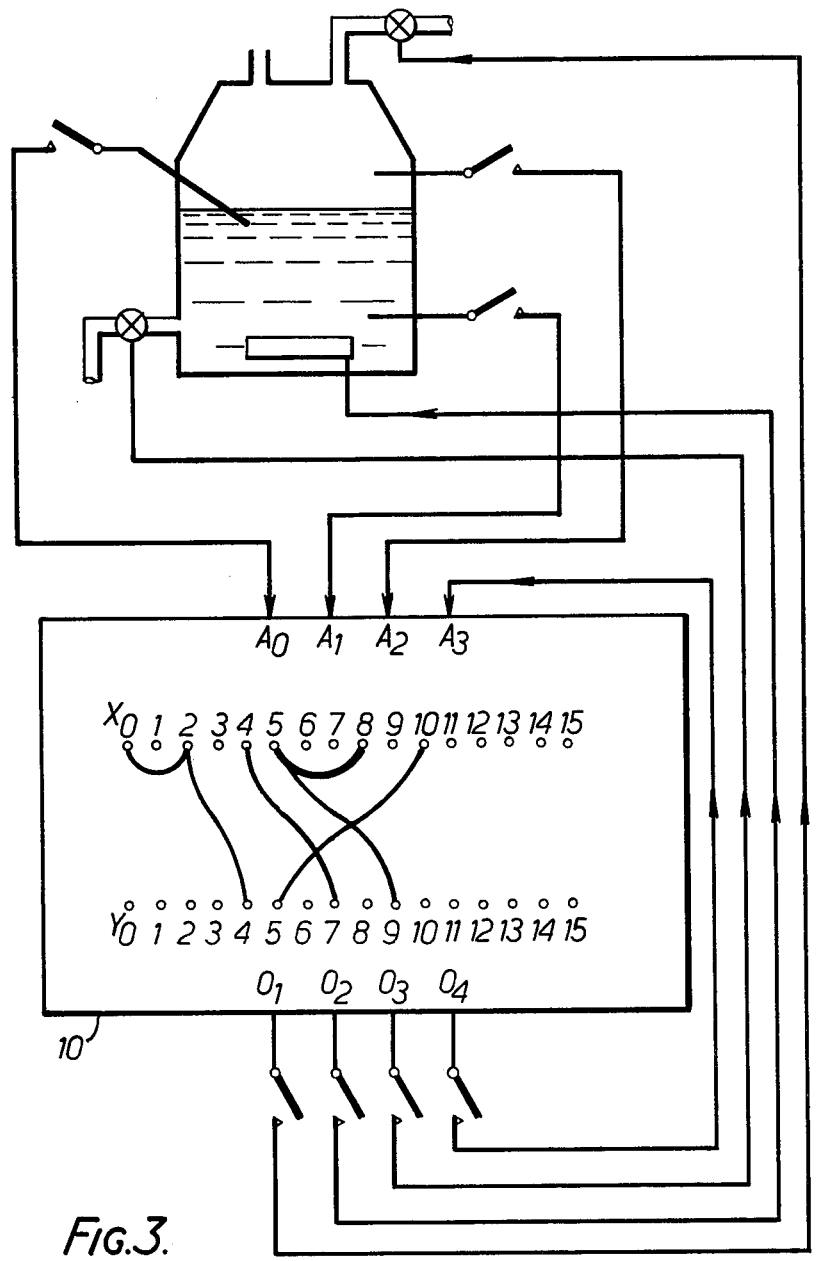
Figure 4:
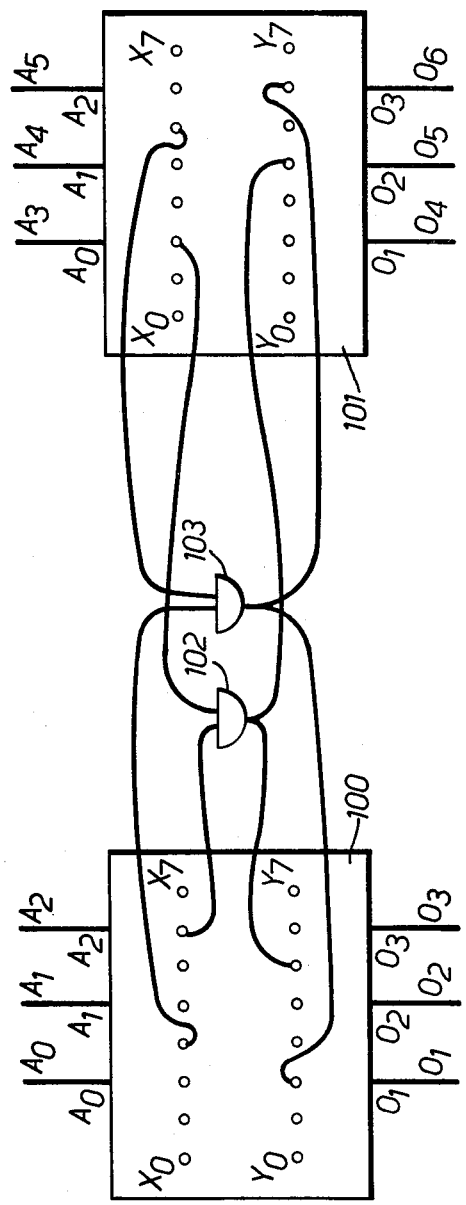
Figure 6A:
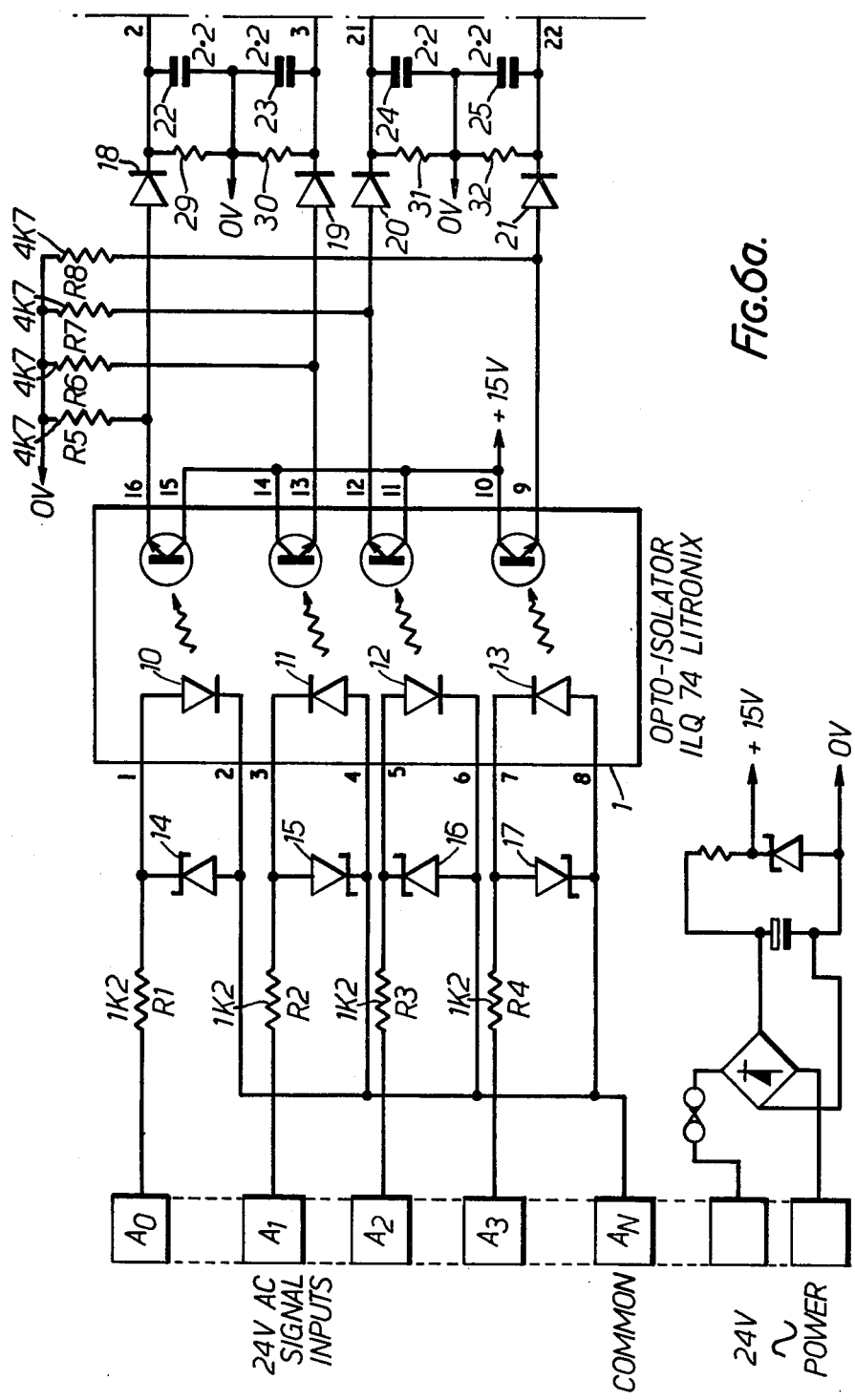
Figure 6B:
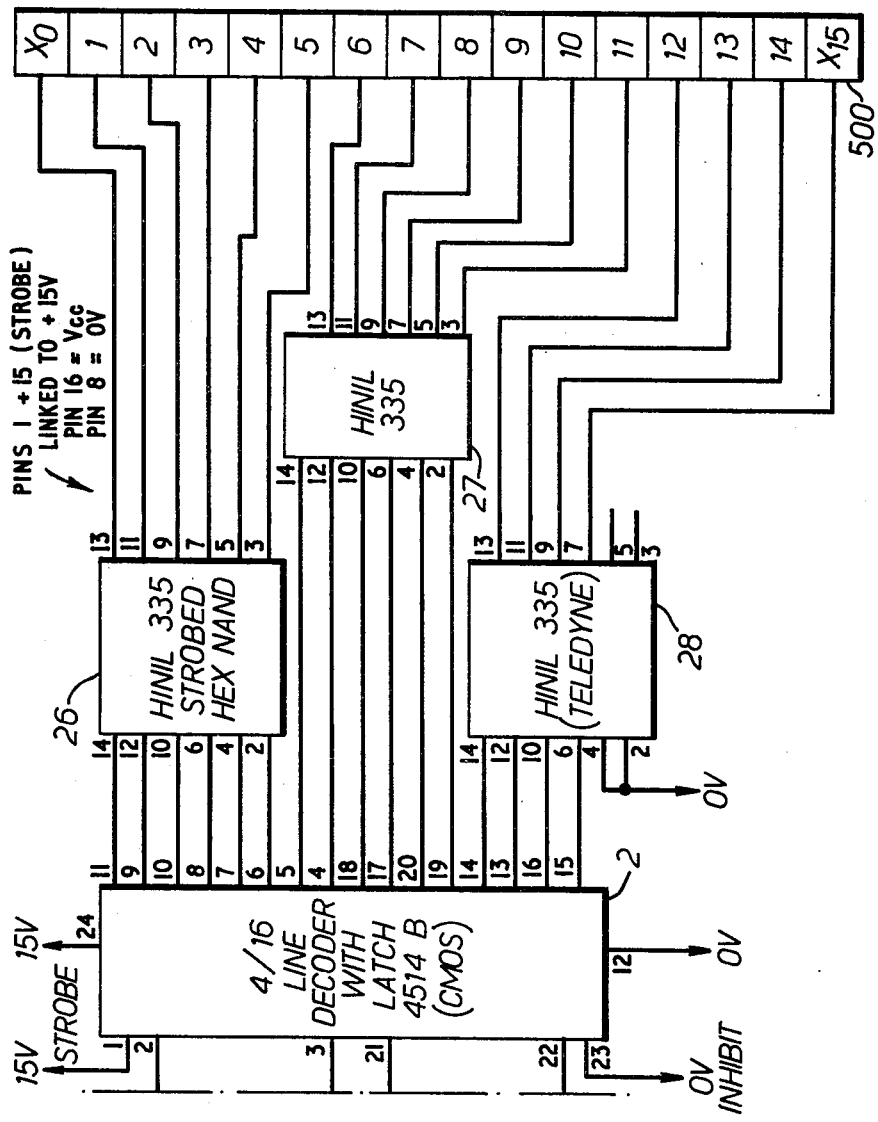
Figure 7A:
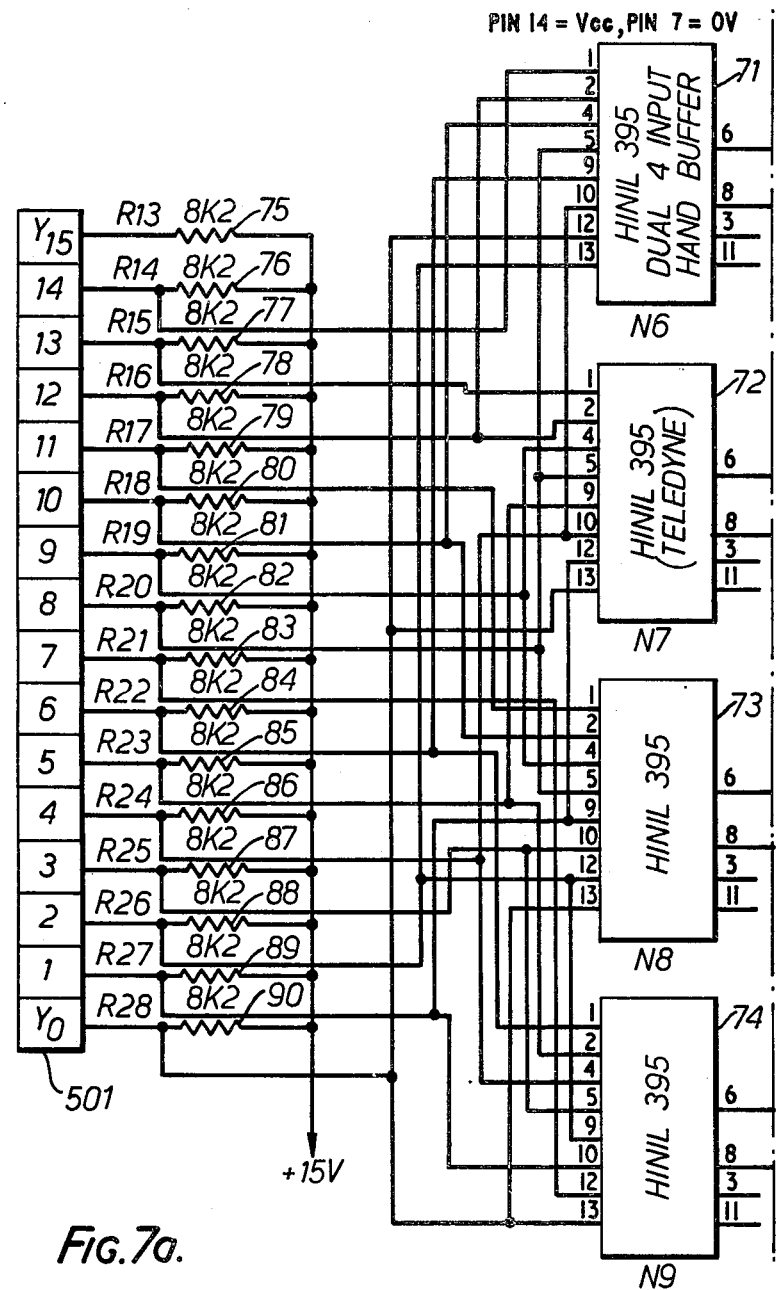
Figure 7B:
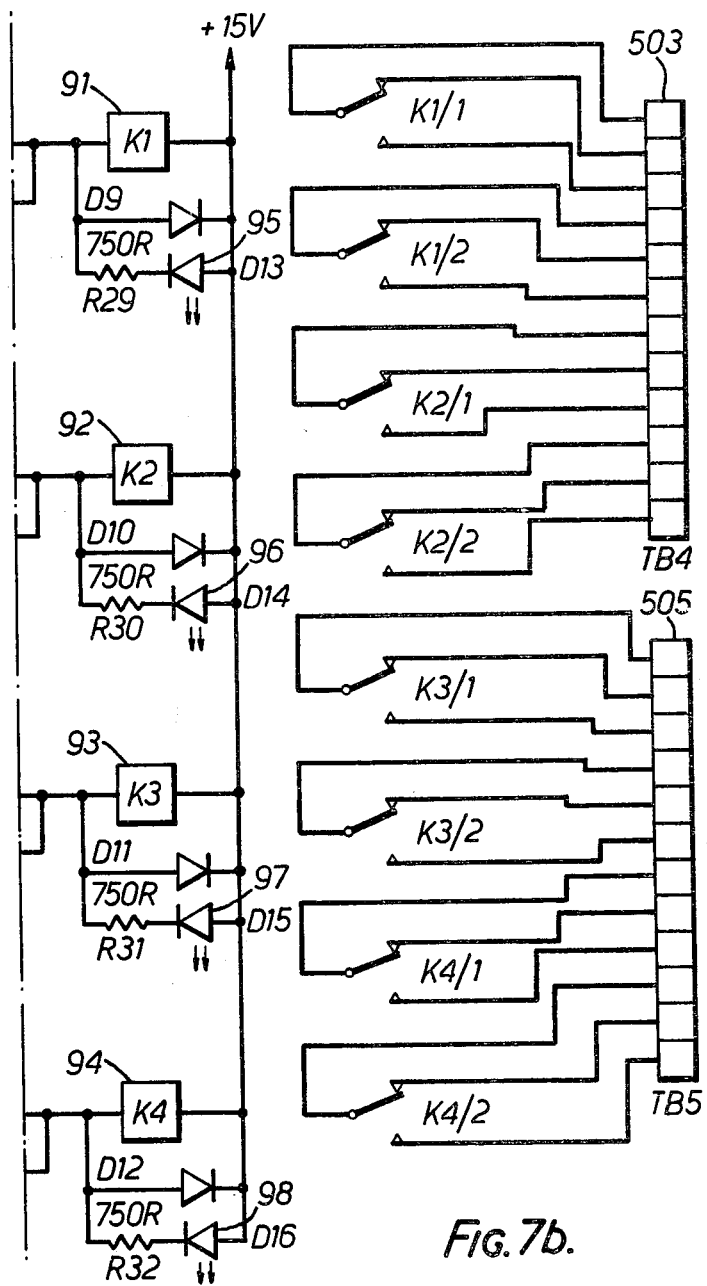
Figure 8:
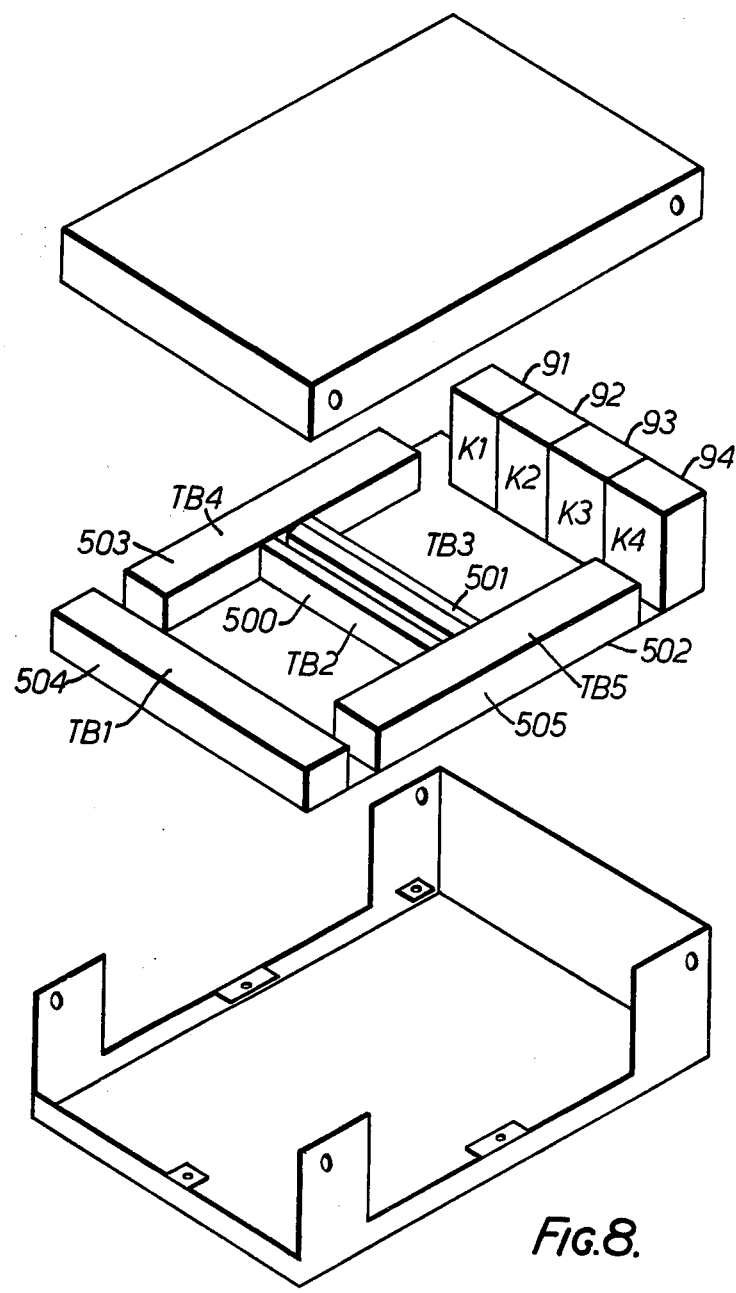
Figure 9:
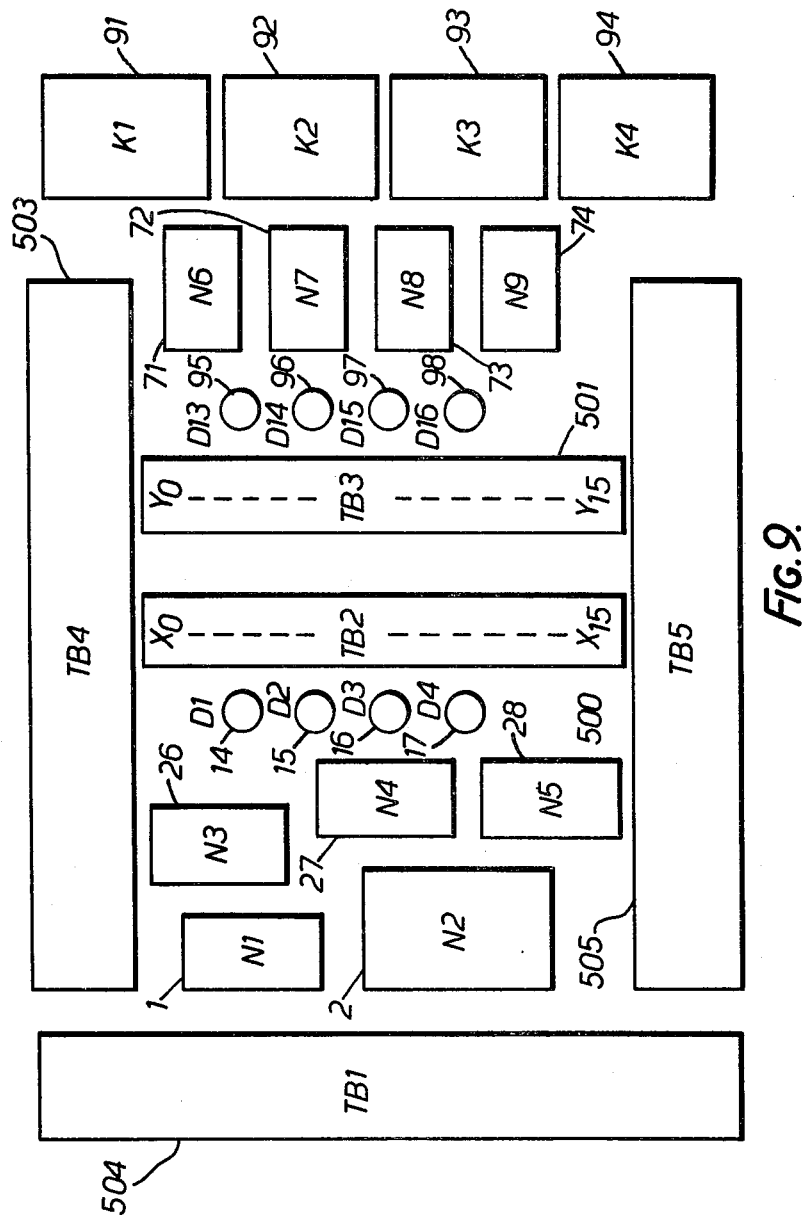

A field programmable read only memory according to the invention, and an adaptive process controller, will now be described by way of example only and with reference to the accompanying drawings in which:

FIG. 1 is a schematic representation of a field-programmable read-only memory according to the invention, FIG. 2 is a schematic representation of an adaptive process controller which includes the field programmable read-only memory of FIG. 1, FIG. 3 is a schematic representation of a water heating system which includes the process controller, FIG. 4 is a schematic representation of two parallel field programmable memories, FIG. 5 is a schematic representation of a field programmable memory with uncommitted logic gates, FIGS. 6a and 6b are a circuit diagram representation of an optoisolator, a decoder, and ancillary components suitable for use as part of FIG. 2, FIGS. 7a and 7b are a circuit diagram representation of an encoder, relay interface system, and ancillary components suitable for use with the part system of FIGS. 6a and 6b, FIG. 8 is a perspective view of the upper part of the adaptive process controller constructed to provide the combined circuits of FIGS. 6a, 6b, 7a and 7b, and showing some major components, and FIG. 9 is a plan view of the adaptive process controller constructed to provide the combined circuits of FIGS. 6a, 6b, 7a and 7b, and showing all major components.

Referring now to FIG. 1, a field programmable read only memory consists of a decoder 2 and an encoder 3, the decoder 2 having four input terminals and sixteen output terminals, and the encoder 3 having sixteen input terminals and four output terminals. The sixteen output terminals of the decoder 2 are identified as $X_0$ to $X_{15}$ and the sixteen input terminals of the encoder 3 are identified as $Y_0$ to $Y_{15}$. Each of the output terminals $X_0$ to $X_{15}$ of the decoder 2 is equipped with a flying lead connection which can be connected to any one of the input terminals $Y_0$ to $Y_{15}$ of the encoder 3. The decoder 2 is of the type which accepts a four-digit input signal and provides an enabling signal to one of the sixteen output terminals $X_0$ to $X_{15}$, the terminal location of the enabling signal corresponding uniquely to the four-digit input code. For example, the input four-digit code 0011 provides an enabling signal on terminal $X_3$, while the input four-digit code 1110 provides an enabling signal on terminal $X_{14}$. The encoder 3 performs the reverse operation to that of the decoder 2. The encoder 3 responds to a single enabling signal on one of the sixteen input terminals $Y_0$ to $Y_{15}$ by providing a corresponding four-digit code on the four output terminals. For example an enabling input signal on the input terminal $Y_3$ would produce a corresponding output four-digit code 0011, and an enabling input signal on the input terminal $Y_{14}$ would produce a corresponding output four-digit code 1110. Therefore by connecting terminal $X_3$ on the decoder 2 to terminal $X_{14}$ on the encoder 3, an input word 0011 to the decoder 2 will result in an output 1110 from the encoder 3. This word transformation can be changed at will by altering the connection pattern between the $X_0$ to $X_{15}$ terminals and the $Y_0$ to $Y_{15}$ terminals. This is achieved easily and in compact form by means of flying leads.

With this manually programmable arrangement, the 16×4 ROM can be fully coded by the manipulation of sixteen links, whereas existing programmable ROMs or field programmable logic arrays of the same capacity would require the fusing of sixty-four links.

In this embodiment, the decoder 2 is a CMOS 4/16 bit decoder, and the output signals from the decoder are used to drive buffer amplifiers which apply a 15 volt output signal to sixteen terminals of a Klippon Type terminal block. The buffer amplifiers are of the high power logal type (H i Nil). The input signals to the encoder 3 are also applied via buffer amplifiers. The encoder 3 is a 16/4 bit CMOS encoder, and its input terminals are connected to earth potential via resistors to ensure that the encoder is not addressed by false signals picked up by the floating input terminals.

The adaptive process controller shown in FIG. 2 is provided with interface units to facilitate its inclusion in a control loop. The sense inputs from plant to be controlled are formed by the inlet ports $A_0$—$A_0$, $A_1$—$A_1$, $A_2$—$A_2$, and $A_3$—$A_3$ which are the inlet ports to a four-channel optically coupled isolator 1. The output terminals of the optically coupled isolators transmit the input signals to the decoder 2 which operates as described above.

The optically coupled isolator 1 provides the practical advantages that it is compact and it can interface the remainder of the system with a variety of input signals. For example, the optically coupled isolator may operate satisfactorily with some 200 V difference between its input and output circuits, which makes the process controller suitable for use with a wide range of plant.

The output signals from the encoder 3 are passed to an output interface network 4 which consists of buffer transistors and miniature relays. The relay contacts are rated at 5 A and 230 V and are of the changeover type. This facilitates the direct connection of the output terminals $O_1$ to $O_4$ of the process controller to a variety of plant. These relays have two stable positions and they may be replaced by flip-flops or similar memories.

Referring now to FIG. 3, an application of a field programmable process controller is illustrated. In FIG. 3, a field programmable process controller 10 is employed as a controller in the heating and batching of water. There are six steps in the heating and batching process, and these are listed below alongside the corresponding sensor conditions and the required control commands.

| Step Numbers | Input Conditions from Sensors | Commands required |
| --- | --- | --- |
| 1 | Tank empty | Close water outlet |
|   |   | Open water inlet |
| 2 | Tank not empty | Close water outlet |
|   | Tank not full | Open water inlet |
| 3 | Tank full | Close water outlet |
|   |   | Close water inlet |
|   |   | Switch on heater |
| 4 | Tank full | Open water outlet |
|   | Water heated | Close water inlet |
|   |   | Switch off heater |
|   |   | *Temp. cycle complete |
| 5 | Tank not empty | Open water outlet |
|   | Tank not full | Close water inlet |
|   | Water heated | Switch off heater |
|   | *Temp. cycle complete | *Temp. cycle complete |
| 6 | Tank empty | Open water outlet |
|   | *Temp. cycle complete | Close water inlet |
|   |   | Switch off heater |
|   |   | *Temp. cycle complete |

*The "Temperature cycle complete" condition is signified by one mode of the "memory latch" facility of the output relay 04.

Step 1

The logical associations are as follows:

| | |
| --- | --- |
| $A_0$ = Temperature up | $O_1$ = Close tank inlet |
| $A_1$ = Tank empty | $O_2$ = Heater on |
| $A_2$ = Tank full | $O_3$ = Close tank outlet |
| $A_3$ = Temp. cycle complete | $O_4$ = Temp. cycle complete |

The following table further identifies the logical relationships and the decoder-encoder connections for the operation:

| | Sequence step number | | | | | | |
| --- | --- | --- | --- | --- | --- | --- | --- |
|  | 1 | 2 | 3 | 4 | 5 | 6 | 1 |
| Inputs |  |  |  |  |  |  |  |
| $A_0$ - Temp. | 0 | 0 | 0 | 1 | 0 | 0 | 0 |
| $A_1$ - Empty | 1 | 0 | 0 | 0 | 0 | 1 | 1 |
| $A_2$ - Full | 0 | 0 | 1 | 1 | 0 | 0 | 0 |
| $A_3$ - Temp. cycle complete | 0 | 0 | 0 | 0 | 1 | 1 | 0 |
| Outputs |  |  |  |  |  |  |  |
| $O_1$ - inlet | 0 | 0 | 1 | 1 | 1 | 1 | 0 |
| $O_2$ - heat | 0 | 0 | 1 | 0 | 0 | 0 | 0 |
| $O_3$ - outlet | 1 | 1 | 1 | 0 | 0 | 1 | 1 |
| $O_4$ - Temp. cycle complete | 0 | 0 | 0 | 1 | 1 | 0c | 0 |
| Pin connections | X2 | X0 | X4 | X5 | X8 | X10 | X2 |
|  | Y4 | Y4 | Y7 | Y9 | Y9 | Y5 | Y4 |

It will be appreciated that the output word corresponding to a particular input word may be altered by changing any one or all of the decoder-encoder connections. This could be done to reprogram the controller for a different application, to modify the existing program in order to achieve slightly different results, or to investigate the effects of parameter variations. The system used in the example has a six-step cycle, but it will be evident that the field programmable controller can be used in systems having up to sixteen cycles.

For systems requiring more than sixteen control commands the arrangement may be expanded by operating the field programmable controllers in parallel, as illustrated in FIG. 4, where the field programmable controllers 100 and 101 are cross-linked via the logic gates 102 and 103 to provide an expanded system. The logic gates 102 and 103 may be AND gates, or they may be OR gates or EXCLUSIVE-OR gates. In the embodiment illustrated in FIG. 4, a composite field programmable controller is provided for six-digit code conversion.

The logic gates required for the embodiment illustrated in FIG. 4 may be provided with an encoder and a decoder within a single integrated circuit, as illustrated in FIG. 5, where the logic gates 104–107 have uncommitted inputs and outputs. In this way, all the semiconductor components may be provided in a single dual-in-line package. Connection of the $E_0$–$E_n$ terminals to another manually programmable memory leads to the arrangement of FIG. 4.

The field programmable read only memory illustrated in FIG. 1 could be provided as a single integrated circuit housed in a standard 40-pin dual-in-line package. The arrangement would be such that the four input terminals, the four output terminals and the thirty-two programming terminals would all be accessible at the pins.

FIG. 6 shows in detail the circuit arrangement of the 4-channel opto-isolator 1 and the 4–16 bit decoder 2 of FIG. 2. In FIGS. 6a and 6b, the input terminal pairs $A_0$–$A_N$ to $A_3$–$A_N$ provide the input terminal pairs of the adaptive process controller of FIG. 2, the terminal pair $A_0$–$A_N$ of FIG. 6 corresponding to the terminal pair $A_0$–$A_0$ of FIG. 2, and so on, with $A_3$–$A_N$ of FIG. 6 corresponding to $A_3$–$A_3$ of FIG. 2.

Zener diodes 14 to 17 which are connected across respective input terminal pairs are arranged to permit the adaptive process controller to respond to a.c. input signals by clamping the a.c. input signals to zero during the negative excursions of the signals and clipping the a.c. input signals off at the zener breakdown voltage during the positive excursions of the signals.

The clipped positive excursions of the a.c. input signals are applied to four light-emitting diodes which are part of the opto-isolators 10 to 13, the transistors of the opto-isolators 10 to 13 being arranged to conduct when their associated light-emitting diodes are forward biassed.

As the transistors of the opto-isolators 10 to 13 conduct, the charge which flows through each of the transistors is collected by means of an associated capacitor. The capacitors which are associated with the opto-isolators 10 to 13 are the capacitors 22 to 25. The capacitors 22 to 25 are connected in parallel with respective resistors 29 to 32 which permit the capacitors to discharge at a controlled rate, and the stored charge on each of the capacitors will fall to zero some short time after its input signal disappears, the discharge period depending on the time constant of the capacitor and its associated resistor. Diodes 18 to 21 which are so connected as to permit the capacitors 22 to 25 to be charged ensure that the capacitors are connected only across their associated resistors 29 to 32 during discharge.

The charge stored on each of the capacitors 22 to 25 results in a potential difference across the plates of each capacitor, and each capacitor is connected to one of four input ports of the decoder 2 which is arranged to provide a logical "1" on a different one of its sixteen output lines for each permutation of signals on its four input lines. The device used as the decoder 2 is a type 4514B CMOS 4 to 16 bit decoder with latching inputs. The STROBE input terminal of the type 4514B decoder is connected to the positive supply rail in order to discard the latching facility. That is, the decoder is so arranged as not to store its input information. The sixteen output terminals of the decoder 2 are connected to an output terminal block with terminals $X_0$–$X_{15}$ by way of buffer amplifiers, which are NAND gates. The NAND gate buffer amplifiers are provided in three blocks 26, 27 and 28, each block being a type 335 HI-NI1 logic block which is available from Teledyne Inc. The terminals $X_0$–$X_{15}$ of the terminal block of FIG. 6 correspond to the terminals $X_0$–$X_{15}$ of FIG. 2.

FIGS. 7a and 7b show in detail the practical implementation of the encoder 3 and the relay interface 4 of FIG. 2. The functions of the encoder 3 and the relay interface 4 are combined, in practice, and as shown in FIGS. 7a and 7b, by means of four DUAL FOUR-INPUT NAND buffers type 395 which are available from Teledyne Inc. The four DUAL FOUR-INPUT NAND buffers are identified in FIG. 7a as 71 to 74. Input terminals $Y_0$–$Y_{15}$ are provided by a terminal block, input terminals $Y_0$, $Y_2$, $Y_4$, $Y_6$, $Y_8$, $Y_{10}$, $Y_{12}$ and $Y_{14}$ of the terminal block being connected to the input terminals of the DUAL FOUR-INPUT NAND buffer 71, input terminals $Y_0$, $Y_1$, $Y_2$, $Y_4$, $Y_5$, $Y_8$, $Y_{12}$ and $Y_{13}$ being connected to the input terminals of the DUAL FOUR-INPUT NAND buffer 72, input terminals $Y_0$, $Y_1$, $Y_2$, $Y_3$, $Y_8$, $Y_9$, $Y_{10}$ and $Y_{11}$ being connected to the input terminals of the DUAL FOUR-INPUT NAND buffer 73, and input terminals $Y_0$, $Y_1$, $Y_2$, $Y_3$, $Y_4$, $Y_5$, $Y_6$ and $Y_7$ being connected to the input terminals of the DUAL FOUR-INPUT NAND buffer 74. Each of the input terminals $Y_0$–$Y_{15}$ of the terminal block is also connected to the positive supply terminal by way of one of sixteen resistors 75 to 90. The four DUAL FOUR-INPUT NAND buffers 71 to 74 perform the encoding operation, and in addition provide the necessary interface circuits for driving relays. Four relay coils, 91 to 94, are connected to the output terminals of respective ones of the DUAL FOUR-INPUT NAND buffers 71 to 74. The relay contacts which are controlled by the relay coils 91 to 94 provide the means of controlling plant over which the system controller is intended to exercise control. Four light-emitting diodes 95 to 98 are used to provide an indication of the logic state of each relay coil 91 to 94.

The perspective view of the upper part of the system controller is provided as an example of a suitable layout of the components and in order to provide a modular structure. In FIG. 9 the relay components 91 to 94 are shown mounted on a plane printed circuit board 502, along with terminal blocks 500 and 501 which provide the respective $X_0$–$X_{15}$, and $Y_0$–$Y_{15}$ terminals. Three further terminal blocks 503, 504 and 505 are shown arranged along three sides of the circuit board 502. The three terminal blocks 503, 504 and 505 provide the remaining input/output facilities of the system controller. The remaining components are fitted above and below the circuit board in the spaces between the components shown in FIG. 8. The location of the remaining components which are fitted in the upper side of the circuit board 502 are shown in FIG. 9, these remaining components being the opto-isolator 1, the decoder 2, the buffer blocks 26, 27 and 28, the encoder consisting of the components 71, 72, 73 and 74, and the diodes 14 to 17 and 95 to 98. Other components such as resistors and capacitors, and some further diodes are not shown, but are all accommodated on the circuit board 502.

Further comparison between existing microprocessor-based systems and the present invention may be useful in order to list various advantages of the invention over known systems.

In a conventional microprocessor based system the method of entering a program is based on a coding arrangement for the stored instruction-data, and this is not standardised, so that the code for any system must be learnt by the user before the microprocess can be put into operation. This would cause no real difficulty to a computer programmer, but microprocesses are intended for use mainly by engineers who must therefore develop such skills to use the microprocessor effectively.

In a conventional microprocessor system the instructions are taken from the memory in sequence under the control of a program counter, and therefore the counter must be arranged to jump instructions from time to time to give the system a degree of flexibility. This facility may be required where the system needs to have an immediate response to certain values of a particular parameter, and the arrangement is such that the control system performs routine operations in sequence until the particular parameter reaches a sensitive value, when the system discontinues routine operations and deals immediately with the problem associated with the particular parameter before returning to routine operation. This flexibility can be achieved only by the use of additional memories and "house-keeping" systems.

There already exist "high-level" languages for microprocessor-based systems, these having been developed to reduce the gulf between the requirements of the engineer user and the actual system, but these "high-level" languages require further investment in hardware for translators and the like. Therefore the eventual cost of a microprocessor-based system may far exceed the apparent cost.

In contrast, a process controller based on the field programmable read only memory of the present invention is in a form familiar to the practising engineer, and the control parameters may be readily associated with controlled conditions within the processing plant. There is very limited specialised programming knowledge required. The controlled parameters will generally be known to or they may be predicted by the engineer directly concerned, and small adjustments may be readily made by the appropriate adjustment of the flying heads.

What I claim is:

1. A field programmable read only memory comprising a decoder having N output terminals and $\log_2 N$ input terminals each being an input terminal to the memory, an encoder having N input terminals and $\log_2 N$ output terminals each being an output terminal from the memory, and a connection matrix so arranged as to be capable of connecting any one or more of the output terminals of the decoder to any one or more of the input terminals to the encoder.

2. A field programmable read only memory as claimed in claim 1, wherein the connection matrix comprises first and second terminal blocks each having N terminals, each of the terminals of the first terminal block being connected to an output terminal of the decoder and each of the terminals of the second terminal block being connected to an input terminal of the encoder, and up to N flying leads arranged to connect any one of the terminals of the first terminal block to any one of the terminals of the second terminal block.

3. A plurality of field programmable read only memories as claimed in claim 1, wherein the field programmable read only memories are connected in parallel.

4. An adaptive process controller including a field programmable read only memory as claimed in claim 1, an input interfacing network having $\log_2 N$ channels each having an output terminal connected to an input terminal of the decoder and an input port providing an input port to the adaptive process controller.

5. An adaptive process controller as claimed in claim 4, and including an output interfacing network having $\log_2 N$ channels each having an input terminal connected to an output terminal of the encoder and an output port from the adaptive process controller.

6. An adaptive process controller as claimed in claim 5, wherein the input interfacing network includes a plurality of pulse transformers.

7. An adaptive process controller as claimed in claim 5, wherein the input interfacing network includes a plurality of optically coupled isolators.

8. An adaptive process controller as claimed in claim 5, wherein the output interfacing network includes a plurality of relays.

* * * * *